United States Patent [19]

Takahashi

[11] 4,293,194
[45] Oct. 6, 1981

[54] SOLID ELECTROCHROMIC ELEMENT

[75] Inventor: Yosuke Takahashi, Sagamihara, Japan

[73] Assignee: Nippon Kogaku K.K., Tokyo, Japan

[21] Appl. No.: 105,505

[22] Filed: Dec. 20, 1979

[30] Foreign Application Priority Data

Dec. 27, 1978 [JP] Japan .................. 53-159927

[51] Int. Cl.³ .............................. G02F 1/17
[52] U.S. Cl. .................................. 350/357
[58] Field of Search ........................ 350/357

[56] References Cited

U.S. PATENT DOCUMENTS 3,971,624 7/1976 Bruesch et al. ............... 350/357

*Primary Examiner*—James W. Davie
*Attorney, Agent, or Firm*—Fitzpatrick, Cella, Harper & Scinto

[57] ABSTRACT

In a solid electrochromic element which comprises a lamination of a first electrode, a dielectric material layer, an electron blocking layer, a solid electrochromic substance layer and a second electrode and in which a voltage is applied between the first and the second electrode to thereby cause coloration of the solid electrochromic substance layer, the electron blocking layer is formed by two layers, of which the layer adjacent to the electrode to which a positive voltage is applied is formed by an N-type semiconductor and the layer adjacent to the electrode to which a negative voltage is applied formed by a P-type semiconductor.

5 Claims, 2 Drawing Figures 2a 3 4 5 2b 1 6 2a 3 4a 4b 5 2b 8
         \___/
           4

SOLID ELECTROCHROMIC ELEMENT

BACKGROUND OF THE INVENTION

1. Field of the Invention

This invention relates to improvements in a solid electrochromic element.

2. Description of the Prior Art

The conventional solid electrochromic element has comprised a solid electrochromic substance layer and a dielectric material layer capable of causing an oxidation-reduction reaction, said two layers being laminated between two electrodes. This element has been such that when a DC field is applied between the two electrodes, an oxidation-reduction reaction is caused between said two layers to cause coloration of the electrochromic layer. However, in this conventional element, a great leakage current which does not directly contribute to the coloration flows between the two electrodes and this has led to a disadvantage that the power consumed is great.

A technique for overcoming such disadvantage is disclosed in Japanese Laid-Open Patent Publication No. 73749/1977. The electrochromic element disclosed in this publication will now be described with reference to FIG. 1 of the accompanying drawings.

The conventional element of FIG. 1 comprises one transparent electrode $2a$ laminated adjacent to a glass substrate 1, a dielectric material layer 3 composed of chromium oxide ($Cr_2O_3$) laminated adjacent thereto, an electron blocking layer 4 composed of tantalum oxide ($Ta_2O_5$) laminated adjacent thereto, a solid electrochromic substance layer 5 composed of tungsten trioxide ($WO_3$) laminated adjacent thereto, and the other transparent electrode $2b$ laminated adjacent thereto.

The electron blocking layer 4 of course blocks the movement of electrons. The electron blocking layer 4 is considered to permit the movement of ions in order for the two layers 3 and 5 to cause an oxidation-reduction reaction therebetween.

The operation of this element will hereinafter be described.

When a main switch is closed and the electrodes $2a$ and $2b$ are connected to the positive pole and the negative pole, respectively, of a DC power source S, the solid electrochromic substance layer 5 and the dielectric material layer 3 cause an oxidation-reduction reaction therebetween and the electrochromic substance layer 5 produces a color. The electron blocking layer 4 blocks the electrons moving between the electrodes which do not contribute to the oxidation-reduction reaction, namely, the leakage current.

In the conventional element as described hereinbefore, $WO_3$, $MoO_3$, etc. used for the solid electrochromic substance layer are oxides which are usually liable to become an N-type semiconductor depending on the manufacturing conditions. On the other hand, substances such as $Cr_2O_3$ and the like used for the dielectric material layer are ones which are liable to become a P-type semiconductor depending on the manufacturing conditions. Accordingly, when a voltage of the coloring polarity is applied to a solid electrochromic element comprising a solid electrochromic substance layer which is an N-type semiconductor and a dielectric material layer which is a P-type semiconductor, just the same effect as that attained by applying a forward voltage to the P-N junction is obtained and if the applied voltage becomes greater, a leakage current will flow even if there is an electron blocking layer. Such leakage current will become greater as the applied voltage becomes greater.

SUMMARY OF THE INVENTION

It is the object of the present invention to provide a solid electrochromic element in which, even if a great forward voltage is applied to a P-N junction formed by a dielectric material layer and a solid electrochromic substance layer, no leakage current is created between the two layers.

The invention will become fully apparent from the following detailed description thereof taken in conjunction with the accompanying drawings.

DESCRIPTION OF THE PREFERRED EMBODIMENT

Figure 1:
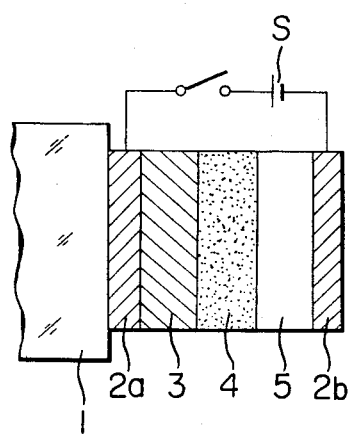
FIG. 1 is a schematic view of the conventional element.

An embodiment of the present invention will hereinafter be described with reference to FIG. 2. The solid electrochromic element according to the present embodiment comprises an anti-reflection film 6 of $Al_2O_3$ laminated on a glass substrate 1, transparent electrode $2a$ of $In_2O_3$ laminated adjacent thereto, a dielectric material layer 3 of NiO exhibiting P-type semiconductivity laminated adjacent thereto, an electron blocking layer 4 laminated adjacent thereto and consisting of an N-type semiconductor layer $4a$ of $WO_3$ and a P-type semiconductor $4b$ of NiO, a solid electrochromic substance layer 5 of $WO_3$ exhibiting N-type semiconductivity laminated adjacent thereto, a transparent electrode $2b$ of $In_2O_3$ laminated adjacent thereto, and an anti-reflection film 8 of $MgF_2$ laminated adjacent thereto. That is, N-P junction as the electron blocking layer 4 is interposed on the P-N junction surface between the dielectric material layer 3 and the solid electrochromic substance layer 5. Therefore, when the electrodes $2a$ and $2b$ are connected to the positive pole and the negative pole, respectively, as shown by solid lines in the drawing and the voltage of a DC power source S is applied in order to cause coloration of the present element, a barrier proportional to the applied voltage is created on the N-P junction surface of the electron blocking layer 4 to block a leakage current in accordance with the applied voltage. Therefore, however great the applied voltage becomes, the leakage current can be blocked.

Also, a positive voltage is applied to the dielectric material layer 3 through the electrode $2a$ and a negative voltage is applied to the electrochromic layer 5 through the electrode $2b$. Accordingly, the dielectric material layer 3 and the electrochromic layer 5 cause an oxidation-reduction reaction therebetween through the electron blocking layer 4, thus causing coloration of the electrochromic layer 5. Where nickel oxide is used as the dielectric material layer 3 as in the present embodiment, this nickel oxide layer is also caused to produce a color by the aforementioned voltage application. All the other layers remain transparent.

In this embodiment, a positive voltage is applied to the N-type semiconductor layer $4a$ of $WO_3$ and a negative voltage is applied to the P-type semiconductor layer $4b$ of NiO and therefore, neither of these layers $4a$ and $4b$ produces a color.

Substances forming the respective layers will now be described. The aforementioned dielectric material layer 3 may be formed of any material which will cause an oxidation-reduction reaction between it and the electrochromic layer 5, and use may be made of not only nickel oxide (NiO) but also, bismuth oxide (BiO), chromium oxide ($Cr_2O_3$), iridium oxide (IrO), titanium oxide ($Ti_2O_3$), manganese oxide (MnO), iron oxide (FeO), cobalt oxide (CoO), silver oxide ($Ag_2O$) or copper oxide ($Cu_2O$). Any of these substances readily becomes a P-type semiconductor depending on the manufacturing conditions.

The aforementioned solid electrochromic substance layer 5 may be formed of not only tungsten trioxide ($WO_3$) but also such substance as molybdenum trioxide ($MoO_3$) or a mixture of $WO_3$ and $MoO_3$. Any of these substances readily becomes an N-type semiconductor depending on the manufacturing conditions.

Substances which can be used for the N-type semiconductor layer $4a$ include not only $WO_3$ but also titanium dioxide ($TiO_2$), vanadium oxide ($V_2O_5$), zinc oxide (ZnO), zirconium oxide ($ZrO_2$), niobium oxide ($Nb_2O_5$), tantalum oxide ($Ta_2O_5$), molybdenum trioxide ($MoO_3$), cerium oxide ($CeO_2$), thorium oxide ($ThO_2$) calcium oxide (CaO), copper oxide (CuO) and hafnium oxide ($HfO_2$). Any of these readily becomes an N-type semiconductor depending on the manufacturing conditions.

Substances which can be used for the P-type semiconductor layer $4b$ include not only NiO but also the substances which can be used for the aforementioned dielectric material layer 3.

The respective layers of the electrochromic element of the present invention may be composed with at least the aforementioned substances as the main components.

Figure 2:
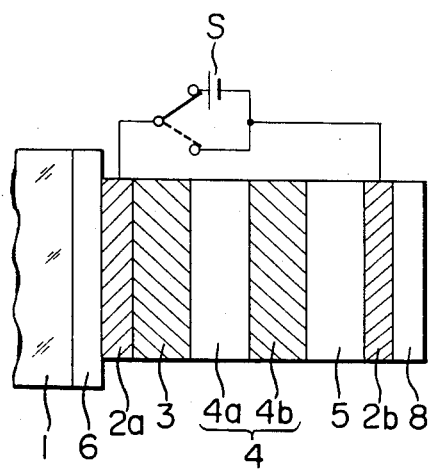
FIG. 2 is a schematic view of an embodiment of the present invention.

The color extinction of the element of the present invention can be quickly accomplished by short-circuiting the two electrodes $2a$ and $2b$ as shown in FIGS. 1 and 2. Of course, the color extinction can also be accomplished by applying an electric field opposite to the electric field applied during the coloration, as in the case of the conventional electrochromic element. The glass substrate used in the present embodiment may be replaced by a white ceramic substrate.

According to the invention, a leakage current between the dielectric material layer and the solid electrochromic substance layer is blocked. It is noted that such a blockage of the leakage current is effected in accordance with the applied voltage.

I claim:

1. A solid electrochromic element which comprises a dielectric material layer, an electron blocking layer, a solid electrochromic substance layer and a second electrode successively laminated on a first electrode and in which a voltage is applied between said first and said second electrode to thereby cause coloration of said solid electrochromic substance layer, the improvement residing in that said electron blocking layer is formed by at least two layers, of which the layer adjacent to the electrode to which a positive voltage is applied is formed by an N-type semiconductor and the layer adjacent to the electrode to which a negative voltage is applied is formed by a P-type semiconductor.

2. The solid electrochromic element according to claim 1, wherein said dielectric material layer is formed by a P-type semiconductor, said electrochromic substance layer is formed by an N-type semiconductor, and a positive voltage and a negative voltage are applied to said first electrode and said second electrode, respectively, to thereby cause coloration of said electrochromic substance layer.

3. The solid electrochromic element according to claim 2, wherein said electrochromic substance layer is composed with tungsten trioxide ($WO_3$) or molybdenum trioxide ($MoO_3$) or a mixture thereof as the main component.

4. The solid electrochromic element according to claim 2, wherein said dielectric material layer is composed with nickel oxide (NiO), bismuth oxide (BiO), chromium oxide ($Cr_2O_3$), iridium oxide (IrO), titanium oxide ($Ti_2O_3$), manganese oxide (MnO), iron oxide (FeO), cobalt oxide (CoO), silver oxide ($Ag_2O$) or copper oxide (CuO) as the main component.

5. The solid electrochromic element according to claim 2, wherein said dielectric material layer is composed with nickel oxide (NiO) as the main component, the N-type semiconductor layer of said electron blocking layer is composed with tungsten oxide ($WO_3$) as the main component, the P-type semiconductor layer of said electron blocking layer is composed with nickel oxide (NiO) as the main component, and said electrochromic substance layer is composed with tungsten trioxide ($WO_3$) as the main component.

* * * * *